(12) United States Patent
Ma et al.

(10) Patent No.: US 7,466,737 B2
(45) Date of Patent: Dec. 16, 2008

(54) HIGH POWER SEMICONDUCTOR LASER DEVICE

(75) Inventors: Byung Jin Ma, Gyunggi-Do (KR);
Seong Ju Bae, Gyunggi-Do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 11/677,646

(22) Filed: Feb. 22, 2007

(65) Prior Publication Data
US 2007/0195844 A1    Aug. 23, 2007

(30) Foreign Application Priority Data
Feb. 22, 2006    (KR) ............... 10-2006-0017419

(51) Int. Cl.
*H01S 5/00*    (2006.01)
(52) U.S. Cl. ............... 372/45.01; 372/43.01; 372/46.01
(58) Field of Classification Search .............. 372/45.01, 372/43.01, 46.01
See application file for complete search history.

(56) References Cited

U.S. PATENT DOCUMENTS

| 5,818,860 A | 10/1998 | Garbuzov et al. |
| 6,798,808 B1 | 9/2004 | Konushi et al. |
| 2007/0183470 A1* | 8/2007 | Nakabayashi ............ 372/46.01 |
| 2008/0008220 A1* | 1/2008 | Ueda et al. ............. 372/45.011 |

FOREIGN PATENT DOCUMENTS

JP    2000-286507    10/2000

OTHER PUBLICATIONS

Korean Office Action with English translation issued in corresponding Korean Patent Application No. KR 10-2006-0017419, mailed on Mar. 26, 2007.

* cited by examiner

*Primary Examiner*—Dung T Nguyen
(74) *Attorney, Agent, or Firm*—McDermott Will & Emery LLP

(57) ABSTRACT

In a high power semiconductor laser device, first and second conductivity type clad layers are provided. An active layer is interposed between the first and second conductivity type clad layers. A first optical guide layer is disposed between the first conductivity type clad layer and the active layer. A second optical guide layer is disposed between the second conductivity clad layer and the active layer. Also, an intentionally undoes optical loss confinement region is formed in a portion of at least one of the first and second conductivity type clad layers overlapping laser beam distribution.

7 Claims, 5 Drawing Sheets

(a)

(b)

HIGH POWER SEMICONDUCTOR LASER DEVICE

CLAIM OF PRIORITY

This application claims the benefit of Korean Patent Application No. 2006-17419 filed on Feb. 22, 2006 in the Korean Intellectual Property Office, the disclosure of which is incorporated herein by reference.

BACKGROUND OF THE INVENTION

1. Field of the Invention

The present invention relates to a high power semiconductor laser device, more particularly, which has superb optical output efficiency due to decreased internal optical loss.

2. Description of the Related Art

Recently, a high power semiconductor laser device has found its various applications, for example, in an industrial field such as optical telecommunication, optical recording devices, welding and cutting and in a medical field. The high power semiconductor laser device is also being used as a visible ray laser for displays, with a prospect for growth in its application in the future.

In general, the semiconductor laser device can have high output characteristics by virtue of two methods. That is, firstly a beam emission portion of laser diodes can be designed in a large size, or secondly the laser diodes are arranged in a long bar shape and the laser bars can be stacked.

The former method concerns enhancing output of the laser diodes themselves. Here, the beam emission portion, i.e., an emitter can be designed with a larger width ("W" of FIG. 1) or a radiator itself can be prolonged to a greater length ("L" of FIG. 1). The emitter with a larger width beneficially achieves high output but may distort beam shape. On the other hand, the resonator with a greater length distorts beam shape less, and lowers current density to restrain temperature rise of the device, thereby enhancing output. However, the resonator with a greater length L disadvantageously degrades optical output efficiency due to internal optical loss [$cm^{-1}$] of the resonator. Therefore, a key in designing the high power semiconductor laser is to reduce internal optical loss of the resonator so that decrease in the efficiency of current-light characteristics can be minimized even if the resonator is prolonged in its length to yield high output.

This internal optical loss of the resonator will be explained with reference to FIG. 1 which illustrates a conventional high power semiconductor laser device.

Referring to FIG. 1, the high power semiconductor laser device 10 includes first and second conductivity type clad layers 12 and 15 formed on a conductive substrate 11 and an active layer 14 interposed therebetween. A first optical guide layer 13a is disposed between the first conductivity type clad layer 12 and the active layer 14, and a second optical guide layer 13b is disposed between the second conductivity type clad layer 15 and the active layer 14. A second conductivity type contact layer 16 is disposed on the second conductivity type clad layer 15. A current blocking layer 17 made of an insulating material is disposed on the second conductivity type contact layer 16 to confine a current injection region. This accordingly defines the region of a resonator R. Also, a first electrode 19a is formed on an underside surface of the semiconductor laser device 10 and a second electrode 19b is formed on a top surface thereof.

The first and second optical guide layers 13a and 13b are undoped layers having higher reflectivity than the first and second conductivity type clad layers 12 and 15. The first and second optical guide layers 13a and 13b serve to confine laser beam shape while the active layer 14 confines movement of electrons and holes. Thus, the first and second optical guide layers 13a and 13b are referred to as a separate confinement heterostructure (SCH) layer. The optical guide layers (or SCH layer) can have a great thickness of about 500 nm to 2 μm, thereby featuring a large optical cavity (LOC) structure. This structure reduces the overlap between the optical mode and the first and second conductivity type clad layers 12 and 15 to lower internal optical loss.

However, in a case where the optical guide layers are increased in thickness to decrease internal optical loss, it may trigger a higher order mode beam, seriously distorting beam shape and causing mismatch with an optical system. This poses difficulty to practical application thereof.

Accordingly, the optical guide layers can be limitedly increased in their thickness. Thus, as shown in FIG. 2, this leads to the beam mode overlapping the first and second conductivity type clad layers 12 and 15, thereby hardly decreasing internal optical loss sufficiently.

Consequently, in the conventional semiconductor laser device, the resonator is limitedly prolonged in its length to enhance output owing to such internal optical loss problems.

SUMMARY OF THE INVENTION

The present invention has been made to solve the foregoing problems of the prior art and therefore an aspect of the present invention is to provide a high power semiconductor laser device capable of confining higher order mode occurrence and reducing internal optical loss in order to design a resonator with a greater length.

According to an aspect of the invention, the semiconductor laser device includes first and second conductivity type clad layers; an active layer interposed between the first and second conductivity type clad layers; a first optical guide layer disposed between the first conductivity type clad layer and the active layer; a second optical guide layer disposed between the second conductivity clad layer and the active layer; and an intentionally undoped optical loss confinement region formed in a portion of at least one of the first and second conductivity type clad layers overlapping laser beam distribution.

Preferably, the optical loss confinement region is adjacent to the first or second optical guide layer so as to be located in a region where greater beam modes are distributed.

Preferably, the optical loss confinement region is formed in both the first and second conductivity type clad layers.

The optical loss confinement region, the active layer and the first and second optical guide layers have a thickness that occupies, preferably, at least 80%, and more preferably, at least 90% of the laser beam distribution.

In the high power semiconductor laser device, preferably, the optical loss confinement region has a thickness of about 10 nm to about 300 nm. Preferably, the optical loss confinement region has a doping concentration of $10^{17}/cm^3$, or less.

In this specification, an "intentionally undoped region" means an undoped layer formed without a process of injecting specific impurities. Here, the intentionally undoped region has a doping concentration of substantially zero, or may have a minor doping concentration (e.g., $5 \times 10^{16}/cm^3$ or less) inevitably resulting from a deposition apparatus or adjacent layers.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 3:
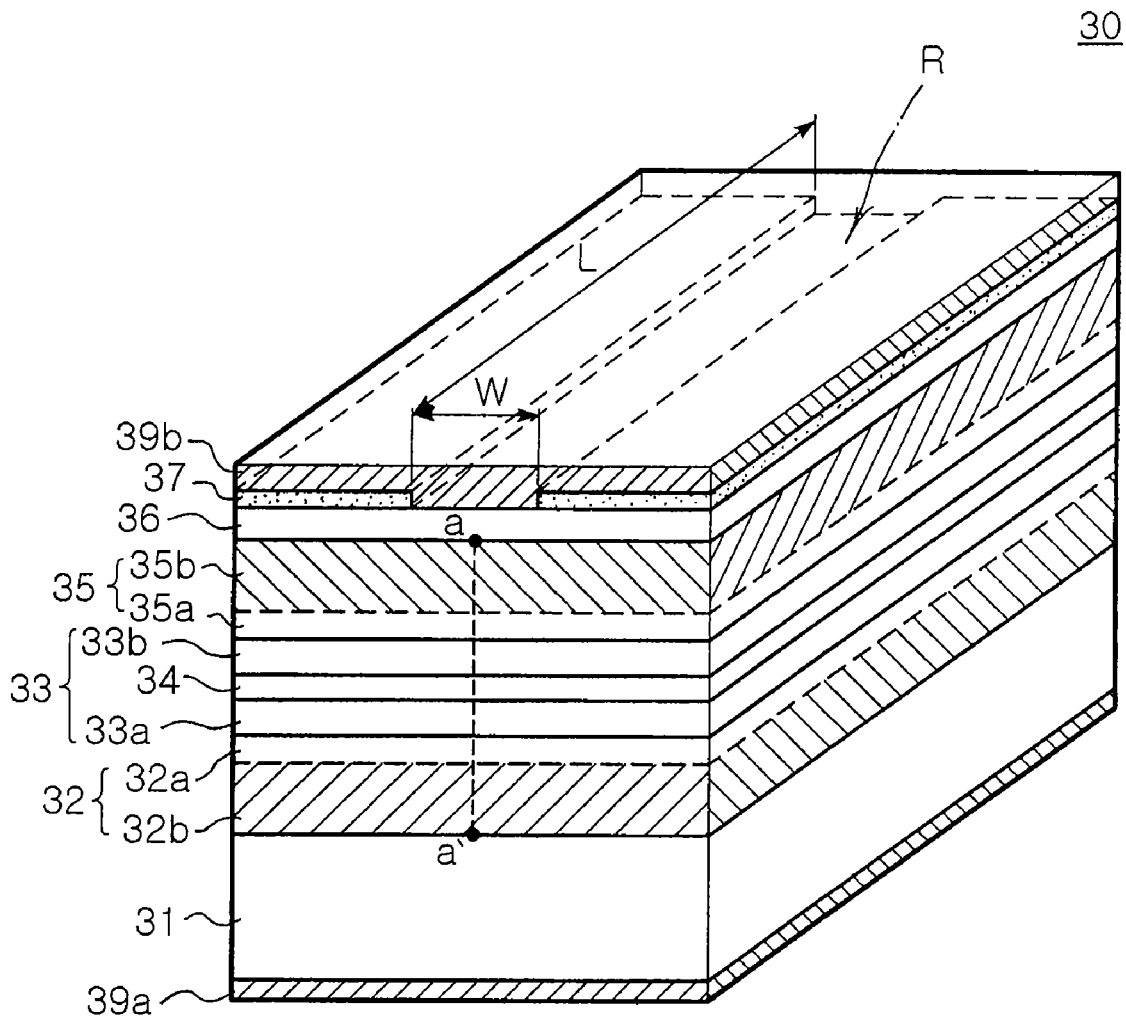
FIG. 3 is a schematic perspective view illustrating a high power semiconductor laser device according to an embodiment of the invention.

FIG. 3 is a schematic perspective view illustrating a high power semiconductor laser device according to an embodiment of the invention.

Referring to FIG. 3, the high power semiconductor laser device 30 includes first and second conductivity type clad layers 32 and 35 formed on a conductive substrate 31 and an active layer 34 interposed therebetween. A first undoped clad layer 32a is disposed between the first conductivity type clad layer 32 and the active layer, and a second undoped clad layer 35a is disposed between the second conductivity type clad layer 35 and the active layer 34. First and second optical guide layers 33a and 33b are undoped layers having higher reflectivity than the first and second conductivity type clad layers 32 and 35 and the first and second undoped clad layers 32a and 35a, respectively. The first and second optical guide layers 33a and 33b feature a separate confinement heterostructure (SCH).

A second conductivity type contact layer 36 is formed on the second conductivity type clad layer 35. Also, a current blocking layer 37 made of an insulating material is formed on the second conductivity type contact layer 36 thereby to define the region of a resonator R. Moreover, a first electrode 39a is formed on an underside surface of the semiconductor laser device 30 and a second electrode 39b is formed on a top surface thereof.

According to the invention, the first and second conductivity type clad layers 32 and 35 include optical loss confinement regions 32a and 35a, respectively that are intentionally undoped as opposed to other doped regions. The optical loss confinement regions 32a and 35b of the invention have a composition the same as that of the first and second conductivity type clad layers 32a and 35, respectively but are intentionally undoped.

Desirably, the optical loss confinement regions 32a and 35a are adjacent to the first and second optical guide layers 33a and 33b, respectively and located in a beam mode distribution region overlapping the first and second conductivity type clad layers 32 and 35. Here, the optical loss confinement regions 32 and 35 are intentionally undoped with presence of only a meager amount of impurities, thereby significantly reduced in internal loss resulting from such impurities.

The clad layers corresponding to the optical loss confinement regions 32a and 35a are intentionally undoped but have a minor doping concentration due to an actual deposition apparatus and impurities diffused from other adjacent clad layers 32b and 35b. Therefore, preferably, the optical loss confinement regions 32a and 35a have a doping concentration of $10^{16}/cm^3$ or less.

As described above, according to the invention, decrease in internal loss prevents decline in optical output efficiency even though the resonator R is designed with a greater length L. This can be explained by following Relation.

That is, a slope efficiency S, i.e., an optical output efficiency can be defined by following Relation which concerns a length of the resonator.

$$S \alpha \frac{\frac{1}{L}\log\frac{1}{R}}{\frac{1}{L}\log\frac{1}{R} + \alpha_i}$$

Here, "L" denotes a length of a resonator of a laser diode, "R" denotes reflectivity on an end face of the laser diode, "$\alpha_i$" denotes loss incurred per unit length while light propagates through the resonator R, i.e., internal loss ratio.

In the above relation, at a larger internal loss ratio $\alpha_i$, the slope efficiency decreases more in accordance with increase in the length L. Therefore, the resonator with a great length lowers current density and restrains temperature rise, beneficially serving to enhance light emitting efficiency. Notwithstanding, actually the length of the resonator can be increased with limitation due to degradation in the slope efficiency.

However, according to the invention, portions of the first and second conductivity type clad layers 32 and 35 adjacent to the first and second optical guide layers 33a and 33b are intentionally undoped to serve as optical loss confinement regions 32a and 35b. This noticeably reduces the internal loss ratio so that the length L of the resonator can be further increased to improve current density and light emitting efficiency.

Therefore, the invention does not adopt increase in a width W of the resonator that may distort beam. In place thereof, the length L of the resonator is increased while suppressing decline in optical efficiency due to internal loss. This reduces current density and restrains temperature rise, while improving optical efficiency remarkably at the same time.

Figure 4:
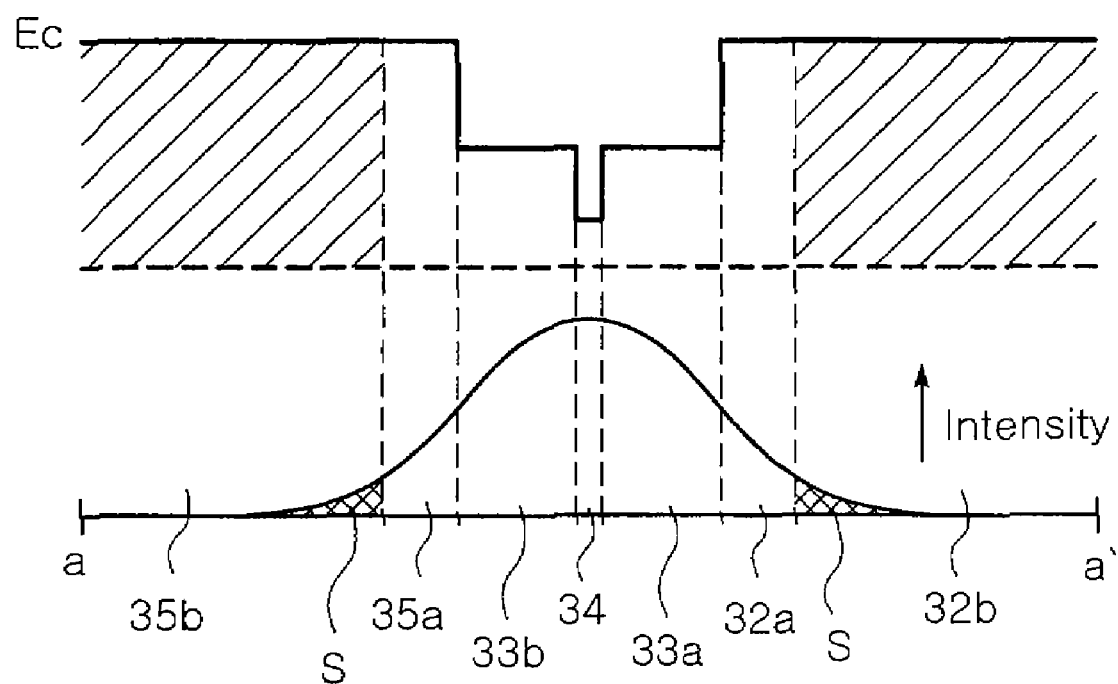
FIG. 4 is a graph illustrating a band gap and beam mode distribution of a high power semiconductor laser device according to another embodiment of the invention.

FIG. 4 illustrates a band gap and beam mode distribution of a high power semiconductor laser device according to an embodiment of the invention.

Figure 1:
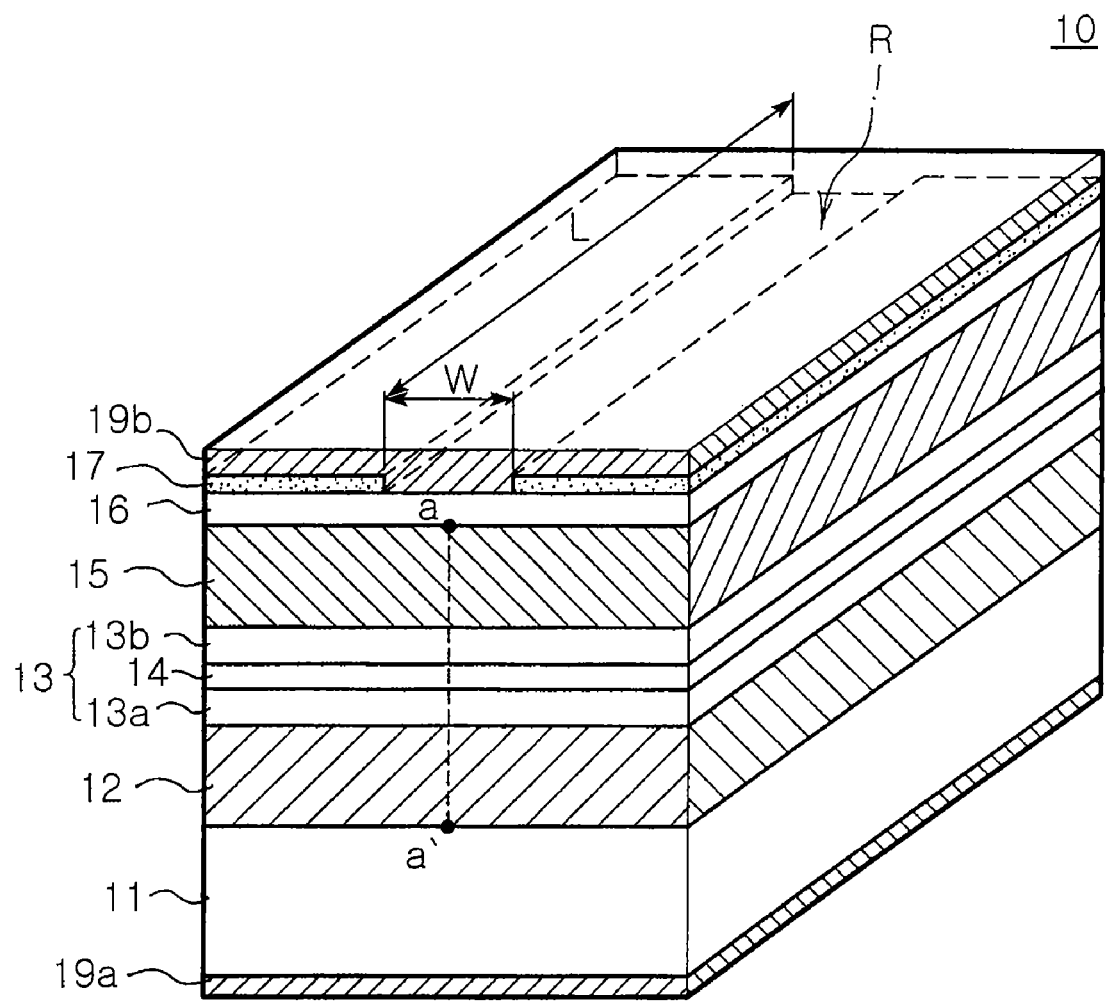
FIG. 1 is a schematic perspective view illustrating a high power semiconductor laser device according to the prior art.
Figure 2:
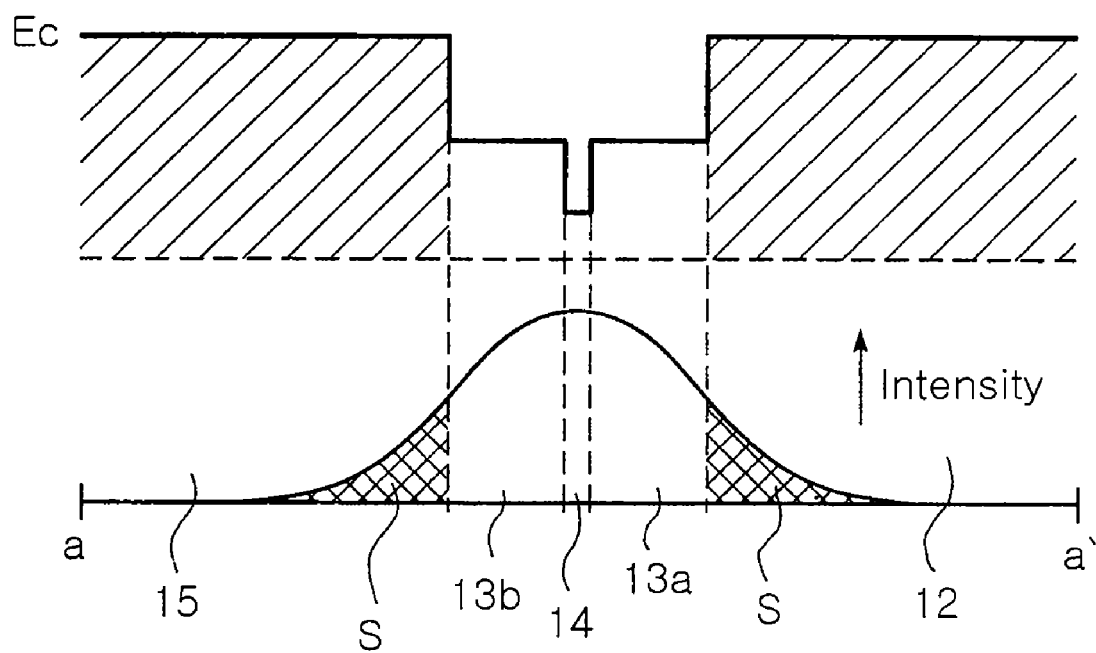
FIG. 2 is a graph illustrating a band gap and beam mode distribution of a high power semiconductor laser device according to the prior art.

FIG. 4 demonstrates a band gap similar to that (conductive band $E_c$) shown in a band diagram of FIG. 2. Here, the first and second conductivity type clad layers 32 and 35 include optical loss confinement regions 32a and 35b adjacent to the first and second optical guide layers 33a and 33b, respectively. Accordingly, the optical loss confinement regions 32a and 35b provide undoped regions continuing from the optical guide layers 33a and 33b. Therefore, according to the invention, the optical guide layers 33a and 33b are not increased in their width to suppress a higher order mode occurrence. In place thereof, a portion of at least one of the first and second conductivity type clad layers 32 and 35 overlapping laser beam distribution is intentionally undoped.

This as a result considerably reduces optical loss incurred in the optical loss confinement regions 32a and 35a that correspond to the regions overlapping the beam mode, thereby diminishing overall internal loss.

Preferably, the optical loss confinement regions 32a and 35a are adjacent to the first or second optical guide layers 33a or 33b so as to be located in a region with greater beam mode distribution. Furthermore, the optical loss confinement regions 32a and 35a, the active layer 34 and the first and second optical guide layers 33a and 33b have a thickness that occupies at least 80% of the laser beam mode distribution. More preferably, the optical loss confinement regions 32a and 35b, the active layer 34 and the first and second optical guide layers 33a and 33b have a thickness that occupies at least 90% of the laser beam mode distribution. This beam mode distribution can be calculated based on reflectivity and thickness of the active layer structure 34 and each layer in a specific laser, and be designed in an adequate thickness.

In a typical high-power semiconductor laser device, the optical loss confinement regions 32a and 35a have a thickness of about 10 nm to 300 nm. The thickness less than 10 nm does not yield sufficient decrease in optical loss. On the other hand, the thickness more than 300 nm requires a higher driving voltage due to increase in the undoped regions.

According to this embodiment of the invention, both the first and second conductivity type clad layers include optical loss confinement regions that are substantially symmetrical to each other. But alternatively, the optical loss confinement regions can be selectively provided to only one of the first and second conductivity type clad layers. Alternatively, the optical loss confinement regions provided to both the first and second conductivity type clad layers may be asymmetrical from each other. These alternatives also fall within the scope of the invention in which an intentionally undoped region is formed in the conventional first and second conductivity type clad layers to reduce optical loss resulting from impurities.

To confirm effects of the invention, according to conventional examples, three semiconductor laser diodes A1, A2 and A3 were prepared, which included p- and n-type conductivity type clad layers each having a doping concentration of $8 \times 10^{17}/cm^3$, $7 \times 10^{17}/cm^3$, and first and second optical guide layers having an undoped active layer interposed therebetween. Also, the semiconductor laser diodes A1, A2 and A3 each had a resonator differing in length (1 mm, 2 mm and 3 mm) and were subjected to simulation. Here, the active layer and the first and second optical guide layers had a thickness of 6 nm, 250 nm and 250 nm, respectively.

Also, calculation was made for three semiconductor laser diodes B1, B2 and B3 according to inventive examples. The three semiconductor laser diodes B1, B2 and B3 had structures the same as those of the conventional examples except that first and second conductivity type clad layers adjacent to the first and second optical guide layers included intentionally undoped optical loss confinement regions each having a thickness of about 100 nm.

Current-voltage simulation results were plotted for the semiconductor laser diodes of the conventional and inventive examples, which featured the structures as described above.

Figure 5:
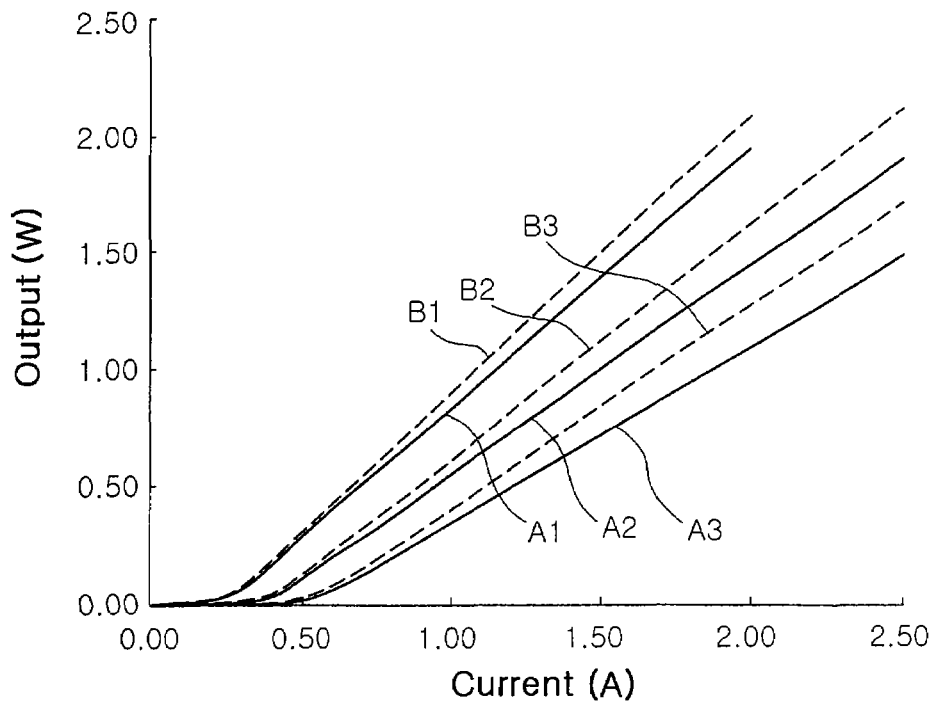
FIG. 5a is a graph illustrating output characteristics of a high power semiconductor laser device manufactured according to further another embodiment of the invention.
FIG. 5b is a graph illustrating voltage-current characteristics of a high power semiconductor laser device manufactured according to further another embodiment of the invention.
Figure 5:
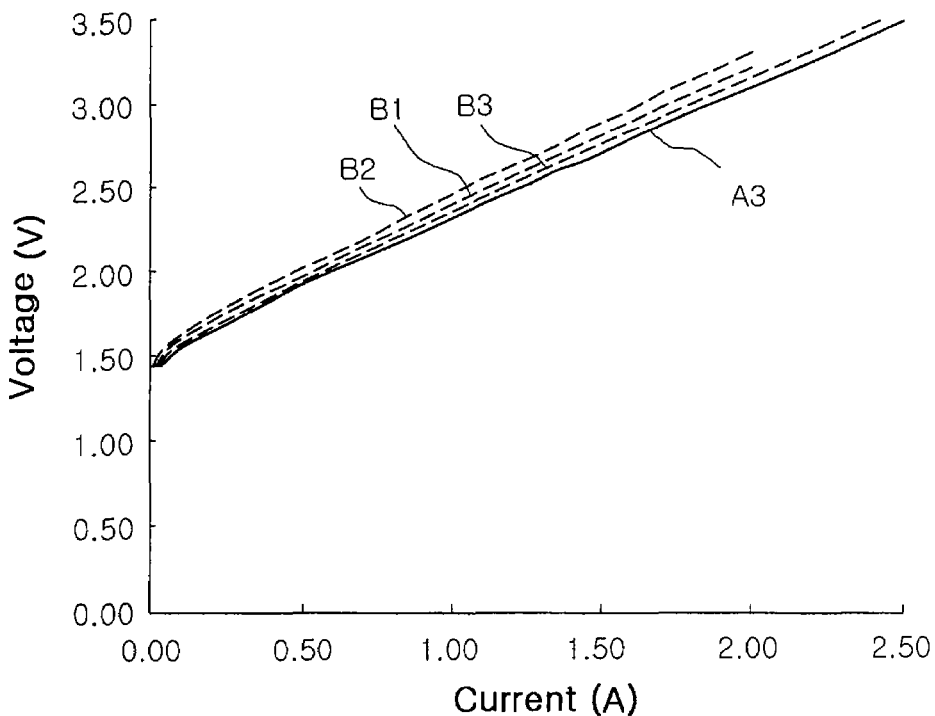

First, as shown in FIG. 5a, the semiconductor laser diodes B1, B2, and B3 of inventive examples were compared with the conventional examples A1, A2 and A3 each having the same resonator length. The inventive examples exhibited 10% to 14% increase in optical output with respect to input current. Moreover, optical output differences between the inventive and conventional examples were increased in accordance with the greater length of the resonator.

As shown in FIG. 5b, in the semiconductor laser diodes B1, B2 and B3 of the inventive examples, a driving voltage increased by a moderate level of 0.1 to 0.25 V compared with the conventional semiconductor laser diode (A3: 3 mm). Such a slight increase in the driving voltage results from the undoped optical loss confinement regions but is considered negligible over improvement in optical output efficiency.

As set forth above, according to exemplary embodiments of the invention, a portion of at least one of first and second conductivity type clad layers overlapping beam mode distribution is intentionally undoped to serve as an optical loss confinement region. This noticeably improves optical output efficiency without big increase in driving voltage. Also, the optical loss confinement region reduces internal loss, thereby allowing a resonator to be designed in a greater length. This lowers current density and effectively suppresses temperature rise, thereby increasing light emitting efficiency.

While the present invention has been shown and described in connection with the preferred embodiments, it will be apparent to those skilled in the art that modifications and variations can be made without departing from the spirit and scope of the invention as defined by the appended claims.

What is claimed is:

1. A semiconductor laser device comprising:
   first and second conductivity type clad layers;
   an active layer interposed between the first and second conductivity type clad layers;
   a first optical guide layer disposed between the first conductivity type clad layer and the active layer;
   a second optical guide layer disposed between the second conductivity clad layer and the active layer; and
   an intentionally undoped optical loss confinement region formed in a portion of at least one of the first and second conductivity type clad layers overlapping laser beam distribution.

2. The semiconductor laser device according to claim 1, wherein the optical loss confinement region is adjacent to the first or second optical guide layer.

3. The semiconductor laser device according to claim 1, wherein the optical loss confinement region is formed in both the first and second conductivity type clad layers.

4. The semiconductor laser device according to claim 1, wherein the optical loss confinement region, the active layer and the first and second optical guide layers have a thickness that occupies at least 80% of the laser beam distribution.

5. The semiconductor laser device according to claim 4, wherein the optical loss confinement region, the active layer and the first and second optical guide layers have a thickness that occupies at least 90% of the laser beam distribution.

6. The semiconductor laser device according to claim 4, wherein the optical loss confinement region has a thickness of about 10 nm to about 300 μm.

7. The semiconductor laser device according to claim 1, wherein the optical loss confinement region has a doping concentration of $5 \times 10^{16}/cm^3$ or less.

* * * * *